United States Patent [19]
Fowler

[11] Patent Number: 5,560,115
[45] Date of Patent: Oct. 1, 1996

[54] GIMBALED MAGNETOMETER WITH INDUCTIVE COUPLING

[75] Inventor: J. Thomas Fowler, Marblehead, Mass.

[73] Assignee: Arthur D. Little Enterprises, Inc., Cambridge, Mass.

[21] Appl. No.: 478,378

[22] Filed: Jun. 7, 1995

[51] Int. Cl.⁶ .................................................... G01C 17/28
[52] U.S. Cl. ................ 33/361; 33/356; 33/363 R; 33/363 Q; 324/244
[58] Field of Search .................... 33/356, 361, 317 R, 33/318, 355 R, 357, 363 R, 363 Q; 324/244, 251, 253, 256, 257, 260

[56] References Cited

U.S. PATENT DOCUMENTS

| | | | |
|---|---|---|---|
| 2,334,469 | 11/1943 | Alexandersson et al. | 33/356 |
| 2,389,146 | 11/1945 | Fragola et al. | 33/361 |
| 2,426,470 | 8/1947 | Sinks | 33/356 |
| 2,671,275 | 3/1954 | Burns, Jr. | 33/361 |
| 3,387,377 | 6/1968 | Patton | 33/356 |
| 5,105,548 | 4/1992 | Fowler | 33/356 |
| 5,170,566 | 12/1992 | Fowler et al. | 33/356 |

*Primary Examiner*—Christopher W. Fulton
*Attorney, Agent, or Firm*—Lappin & Kusmer LLP

[57] ABSTRACT

An apparatus for mounting a magnetometer including a frame and a platform mounted for rotation within the frame. The magnetometer and one or more counterweights are mounted within the platform such that gravity acting on the counterweights maintains the magnetometer in a horizontal orientation. A first coil is coupled in parallel with the magnetometer and is wound around the perimeter of the platform. A second coil is wound around the perimeter of the frame such that the first and second coils form an air core transformer. The second coil terminates in two terminals which provide a communication port. A sensing circuit coupled to the port electrically communicates with the magnetometer via the inductive coupling provided by the transformer. In alternative embodiments, each of the first and second coils is implemented as two coils with associated diodes. The coils are wound such that they create four transformers, two of the transformers being characterized by a first coupling coefficient and two of the transformers being characterized by a second coupling coefficient. In this embodiment, the inductive coupling provided by the four transformers permits a sensing circuit to apply a bias signal to the magnetometer thereby driving the magnetometer to null balance so that it does not magnetically interfere with any other magnetometers in close proximity, and to allow the magnetometer to operate in a more linear fashion.

46 Claims, 10 Drawing Sheets

GIMBALED MAGNETOMETER WITH INDUCTIVE COUPLING

FIELD OF THE INVENTION

The present invention relates generally to compasses and magnetometers, and more particularly to an improved gimbaled magnetometer particularly useful in a fluxgate compass, clinometer or similar device.

BACKGROUND OF THE INVENTION

Various compasses which measure the horizontal component of the earth's magnetic field and provide an indication of magnetic heading are known in the prior art. One type of well known compass includes fluxgate attitude sensors in the form of magnetometers, which in addition to providing an indication of heading also provide an indication of the pitch and roll angles of the sensors relative to a horizontal plane. Such sensors are commonly used in towed array configurations for underwater seismic exploration. One such fluxgate compass is described in U.S. Pat. No. 5,170,566, issued to J. Thomas Fowler and George E. Selecman on Dec. 15, 1992, which is assigned to the assignee of the present invention, and which is hereby incorporated by reference.

Fluxgate compasses typically include two orthogonally disposed fluxgate magnetometers for measuring the horizontal component of the earth's magnetic field. Each magnetometer defines a sensing axis and measures the strength of the component of the earth's magnetic field that is parallel to its sensing axis. Each magnetometer is mounted on a gimbaled platform that uses counterweights to maintain the magnetometer, and its sensing axis, in a horizontal orientation. The sensing axes are typically referred to as the X and Y axes. One magnetometer therefore measures the X component $H_x$ of the earth's magnetic field, and the other magnetometer measures the Y component $H_y$. An indication of heading, (i.e., the direction of heading with respect to magnetic north), is provided by the function shown in Equation (1).

$$\text{HEADING} = \arctan\left(\frac{H_y}{H_x}\right) \quad (1)$$

Fluxgate compasses also often include an additional sensor for measuring the vertical component $H_z$ of the earth's magnetic field. This vertical sensor is sometimes implemented as two orthogonally disposed magnetometers that are fixed, or "strapped down", to the frame of the compass, and is sometimes implemented as a single magnetometer mounted on a gimbaled platform such that the magnetometer remains in a vertical orientation. Measuring the vertical component is useful since the accuracy of the heading indication provided by Equation (1) varies with latitude, and by using the measured $H_z$ component it is possible to use known methods to provide correction terms for Equation (1) so that heading may be accurately measured at any latitude.

As stated above, fluxgate attitude sensors contain additional devices for measuring the pitch and roll angles of the sensor relative to a horizontal plane. These additional devices may be implemented as excitation coils, sometimes referred to as Helmholtz coils, wound around the outside of the platform supporting the sensors so that the platform moves relative to the coils. Pitch and roll measurements are made by monitoring the X and Y magnetometers while the excitation coils are sequentially energized.

One problem with such prior art devices is that the gimbaled platforms use slip rings, conductive bearings, or other such connectors which rely upon physical contact to establish an electrical connection between the magnetometer and an external sensing circuit. Such "contact-type" connections are disadvantageous because they create friction that limits the leveling accuracy of the gimbals. Further, they do not provide a high quality electrical connection and may form an open circuit when the sensor is subjected to sudden movements or impacts and thus cause an interruption, or a "glitch", in the operation of the device. Also, such connectors are prone to wear and tend to limit the useful lifetime of the device.

There is therefore a need for a fluxgate compass that does not use "contact-type" connectors to provide electrical connection to the gimbaled magnetometers.

OBJECTS OF THE INVENTION

Accordingly, it is an object of the present invention to substantially reduce or overcome the above-identified problems of the prior art.

Another more specific object of the present invention is to provide a fluxgate compass including an inductive coupling for providing electrical communication between a sensing circuit and each gimbaled magnetometer.

Yet another object of the present invention is to provide an inductive coupling between a sensing circuit and a gimbaled magnetometer that permits the circuit to apply a bias signal to the magnetometer.

Another object of the present invention is to provide a fluxgate compass including an inductive coupling for providing electrical communication between a sensing circuit and gimbaled magnetometers and for permitting the sensing circuit to apply a bias signal to the magnetometers thereby preventing the magnetometers from magnetically interfering with each other.

Still another object of the present invention is to provide a fluxgate compass that does not use "contact-type" connectors to provide electrical connection to the gimbaled magnetometers.

SUMMARY OF THE INVENTION

These and other objects are provided by an improved apparatus for mounting a magnetometer. The apparatus includes a frame and a platform mounted for rotation within the frame. A magnetometer and one or more counterweights are mounted within the platform such that gravity acting on the counterweights maintains the magnetometer in a horizontal orientation. A first coil is electrically coupled in parallel with the magnetometer and is wound around the perimeter of the platform. A second coil is wound around the perimeter of the frame such that the first and second coils form an air core transformer. The second coil terminates in two terminals which provide a communication port. A sensing circuit coupled to the port electrically communicates with the magnetometer via the inductive coupling provided by the transformer.

In alternative embodiments, each of the first and second coils is implemented as two coils with associated diodes. The coils are wound such that they create four transformers, two of the transformers being characterized by a first coupling coefficient and two of the transformers being characterized by a second coupling coefficient. In this embodiment, the inductive coupling provided by the four transformers permits a sensing circuit to apply a bias signal to the magnetometer thereby driving the magnetometer to null balance so that it does not magnetically interfere with any other magnetometers in close proximity.

Still other objects and advantages of the present invention will become readily apparent to those skilled in the art from the following detailed description wherein several embodiments are shown and described, simply by way of illustration of the best mode of the invention. As will be realized, the invention is capable of other and different embodiments, and its several details are capable of modifications in various respects, all without departing from the invention. Accordingly, the drawings and description are to be regarded as illustrative in nature, and not in a restrictive or limiting sense, with the scope of the application being indicated in the claims.

BRIEF DESCRIPTION OF THE DRAWINGS

For a fuller understanding of the nature and objects of the present invention, reference should be had to the following detailed description taken in connection with the accompanying drawings in which the same reference numerals are used to indicate the same or similar parts wherein:

FIGS. 1A, 1B, and 1C are radial, axial, and perspective views, respectively, of a platform for mounting a magnetometer in accordance with the present invention;

DETAILED DESCRIPTION OF THE DRAWINGS

Figure 1C:
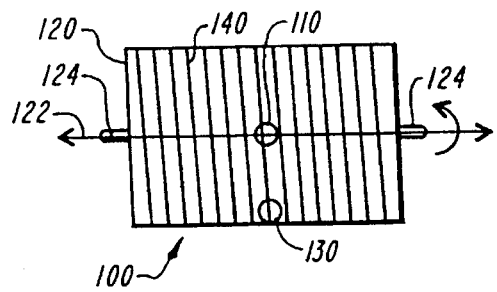

FIGS. 1A, 1B, and 1C, are respectively simplified front, side, and perspective views of a portion of one preferred system 100 for mounting a fluxgate magnetometer or sensor coil 110 used to measure one component, for example the Y component $H_y$, of the earth's magnetic field. System 100 includes a cylindrical platform 120 which extends along and preferably is coaxial with a roll axis 122. A pair of gimbal bearings 124 mount platform 120 to a frame (not shown) and permit platform 120 to freely rotate about roll axis 122. Magnetometer 110 extends along and preferably is coaxial with axis 112 (otherwise referred to as the Y axis) and is preferably mounted within platform 120 such that axes 112 and 122 intersect and are perpendicular. A suitable amount of additional weights, such as provided by counterweights 130, is attached to the platform 120 so as to maintain magnetometer 110 in a substantially horizontal orientation. A coil 140 is electrically coupled in parallel with magnetometer 110 and is wound around the perimeter of platform 120 so as to preferably define a cylindrical coil having a cylindrical axis disposed in a direction that is, preferably perpendicular to the windings of magnetometer 110 so that magnetometer 110 and coil 140 do not magnetically interfere with one another.

Figure 2:
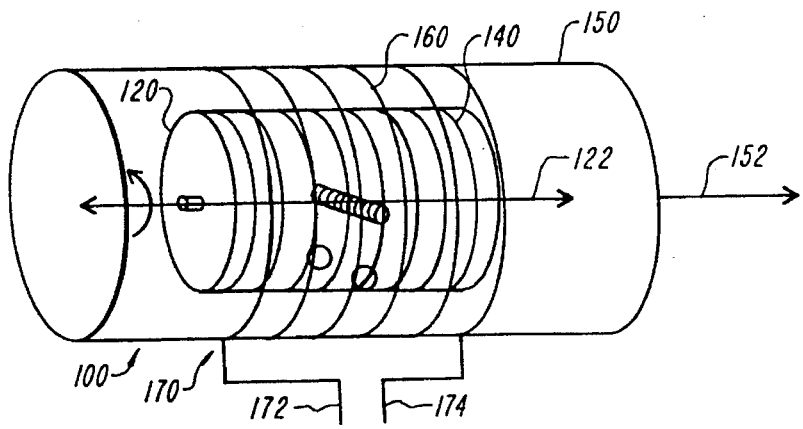
FIG. 2 is a perspective view of a system according to the invention including a frame and the platform shown in FIGS. 1A, 1B, and 1C.

FIG. 2 is a perspective view of system 100 showing platform 120 mounted within a cylindrical frame 150 which extends along and is coaxial with an axis 152. Platform 120 is mounted such that roll axis 122 is coaxial with axis 152 and such that platform 120 may freely rotate about roll axis 122 within frame 150. Frame 150 is preferably filled with a fluid, such as oil, so that platform 120 is neutrally buoyant within frame 150. A coil 160 is wound around the cylindrical frame 150 so that the coil is parallel to and coaxial with coil 140. Coil 140 is disposed within coil 160 such that coils 160 and 140 form the primary and secondary respectively of an air core transformer 170. As used herein the term air core transformer refers to a transformer having a permeability $\mu$ of approximately one, (i.e., a transformer with a non-ferrous core) so transformer 170 may be properly referred to as an air core transformer even though primary 160 and secondary 140 are preferably separated by a fluid. Coil 160 terminates at two terminals 172, 174.

Figure 3:
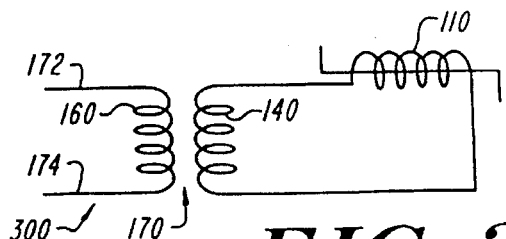
FIG. 3 is a schematic of the circuit formed by the coils and the magnetometer shown in FIG. 2.

FIG. 3 is a schematic of the circuit 300 formed by transformer 170 and magnetometer 110 showing how the coils 110, 140 and 160 are electrically and magnetically coupled together. Terminals 172 and 174 provide electrical access to primary 160. Secondary 140 is electrically connected in parallel with magnetometer 110. Coils 140 and 160 are fully magnetically coupled since they are coaxial, while both are substantially magnetically isolated with respect to coil 110, since coils 140 and 160 are both oriented perpendicularly to the coil 110. As will be discussed further below, by applying an A.C. signal to terminals 172, 174, magnetometer 110 may be used to measure the strength of the X component $H_x$ or the Y component $H_y$ of the earth's magnetic field where the X and Y axes are each taken to have a horizontal orientation. Terminals 172, 174 therefore provide a port for communicating signals between magnetometer 110 and an external sensing circuit.

Since an external sensing circuit couples to magnetometer 110 via the inductive coupling provided by transformer 170 rather than by mechanical "contact-type" connectors, gimbal bearings 124 need not be electrically conductive, and may therefore be of simple construction. Such simple bearings have friction coefficients that are far lower than that of electrically conductive bearings and therefore provide improved performance.

Fluxgate magnetometer 110 is preferably implemented as a coil with one or more windings containing saturable magnetic material that can be used to measure magnetic fields over wide dynamic ranges. Although magnetometer 110 is shown in FIG. 3 as a solenoid type sensor with a single coil wrapped around a single rod of magnetic saturable material, other types of two terminal flux gate magnetic sensors may be used.

Figure 4:
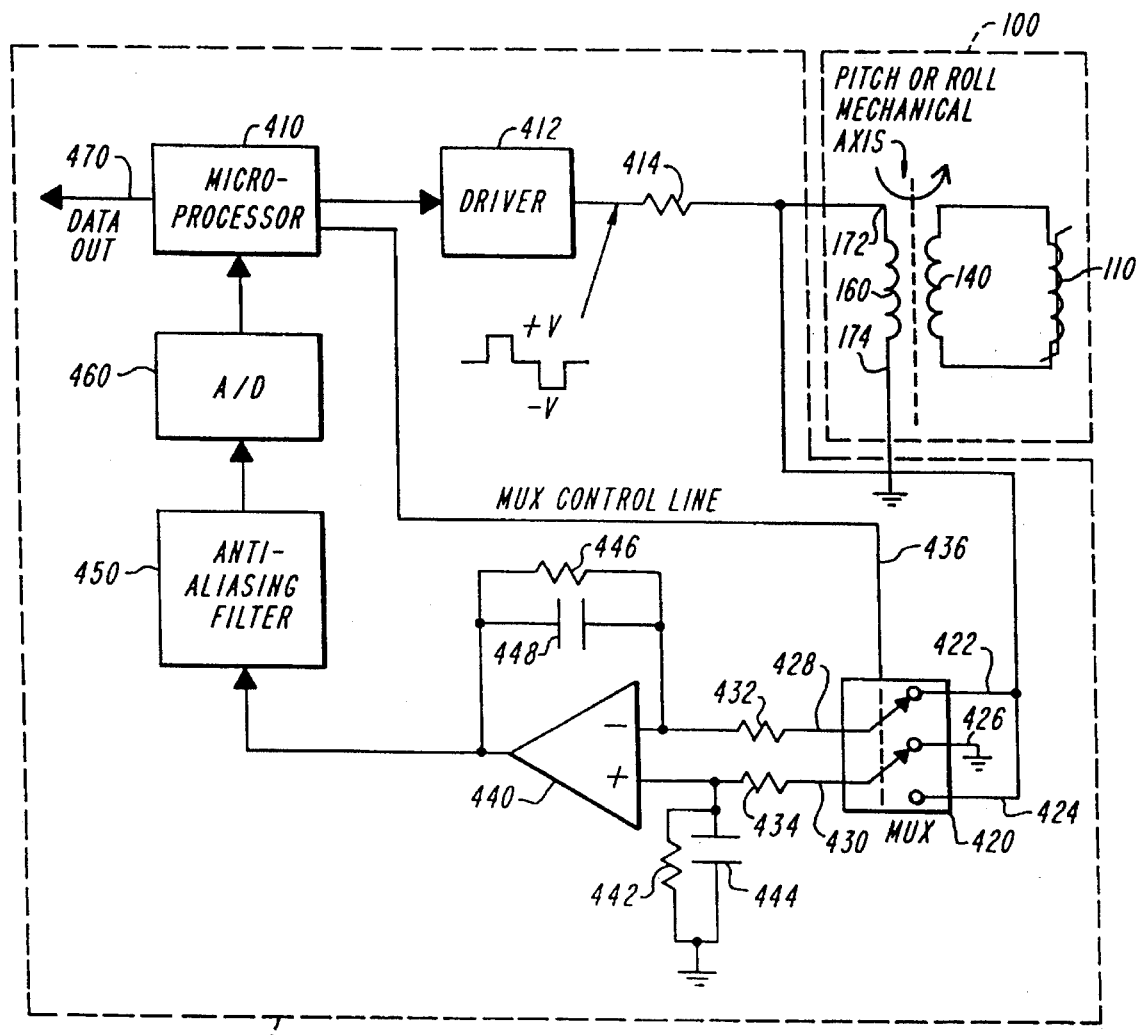
FIG. 4 is a schematic of a sensing circuit for use in connection with the system shown in FIG. 2 for measuring the amplitude of a component of the earth's magnetic field.

FIG. 4 is a schematic of one preferred sensing circuit 400 for use in conjunction with system 100 for measuring the amplitude, for example, of the Y component $H_y$ of the earth's magnetic field. Preferably, although not necessarily, sensing circuit 400 is implemented on a circuit board which is also mounted within frame 150 (shown in FIG. 2). Circuit 400 includes a microprocessor 410 one output of which is applied to the input of a driver 412. In one preferred embodiment, driver 412 produces a drive signal that is a pulsed AC output drive preferably at frequency greater than about 10 KHz, although as those skilled in the art will appreciate the invention will function well with drive signals having other frequencies and characteristics. The output of driver 412 is coupled through a resistor 414 to terminal 172 of system 100. Preferably, transformer 170 is a high bandwidth transformer capable of passing the drive signal from node 172 to magnetometer 110. The other terminal 174 of system 100 is coupled to a reference potential (i.e., ground). Terminal 172 is also coupled to two terminals 422, 424 of a double pole, double throw switch 420. Another terminal 426 of switch 420 is coupled to ground. A terminal 428 of switch 420 is coupled through a resistor 432 to the inverting input of an operational amplifier 440, and a terminal 430 of switch 420 is coupled through a resistor 434 to the non-inverting input of amplifier 440. Switch 420 can switch between two states, a forward state and a flyback state, and the state of switch 420 is controlled by a select input 436 which is coupled to a multiplexing control output line of microprocessor 410. In the forward state, switch 420 couples terminal 422 to terminal 428, and couples terminal 426 to terminal 430. In the flyback state, switch 420 couples terminal 426 to terminal 428, and couples terminal 424 to terminal 430. Preferably, resistors 432 and 434 have the same resistance value.

A resistor 442 and a capacitor 444 are coupled in parallel between the non-inverting input of amplifier 440 and ground, and a resistor 446 and a capacitor 448 are coupled in parallel in a feedback configuration between the inverting input and the output of amplifier 440. Preferably, resistors 442 and 446 have the same resistance value and capacitors 444 and 448 have the same capacitance value. Amplifier 440 thus is preferably implemented as a fixed gain, differential, integrating amplifier. The output of amplifier 440 is applied to the input of an anti-aliasing filter 450, the output of which is applied to the input of an analog to digital converter 460. The output of converter 460 is applied to an input of microprocessor 410, which in turn provides a data output 470.

In operation, microprocessor 410 applies a signal to driver 412 which generates a drive signal at its output that is a periodic A.C. square wave signal which in one period transitions sequentially from a positive D.C. voltage state +V, to a high impedance state, to a negative D.C. voltage state −V, to a high impedance state. Driver 412 may be implemented as a voltage source as shown in FIG. 4, or as a current source in which case resistor 414 is unnecessary. Microprocessor 410 controls switch 420 synchronously with the drive signal generated by driver 412 such that when the drive signal is in either the positive voltage state +V or the negative voltage state −V, the switch is in the forward state (as shown in FIG. 4) and switch 420 couples terminal 172 to the inverting input of amplifier 440 via resistor 432 and couples the non-inverting input of amplifier 440 to ground via resistor 434. Microprocessor 410 further controls switch 420 such that when the drive signal at the output of driver 412 is in the high impedance state, switch 420 is in the flyback state and couples the inverting input of amplifier 440 to ground via resistor 432 and couples the non-inverting input of amplifier 440 to terminal 172 via resistor 434. As those skilled in the art will appreciate, amplifier 440 integrates the response of magnetometer 110 to the drive signal.

Figure 5:
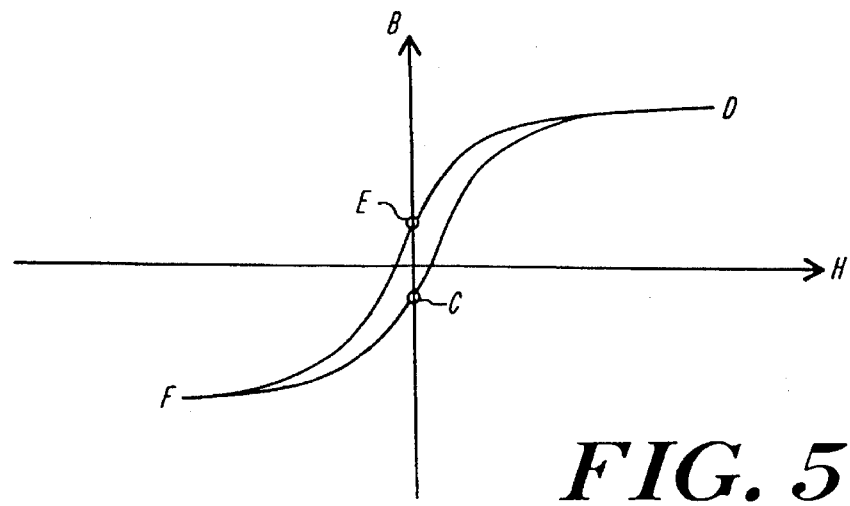
FIG. 5 is a graph of the well known hysteresis characteristic of ferromagnetic materials.

The operation of circuit 400 may be understood by analyzing the response of magnetometer 110 to one period of the drive signal. The drive signal is applied to magnetometer 110 via resistor 414 and transformer 170. The response of magnetometer 110 to the drive signal is governed by the well known hysteresis characteristic of ferromagnetic materials which is illustrated in FIG. 5. Referring to FIGS. 4 and 5, during the first interval of one period of the drive signal, in which the drive signal is in the +V state, magnetometer 110 is driven to saturation as shown by the curve between points C and D (shown in FIG. 5). During this interval, the voltage at terminal 172 is increasing and is applied to the inverting input of integrating amplifier 440. During the next interval, when the drive signal is in a high impedance state, the energy stored in magnetometer 110 "flies back" as shown by the curve between points D and E in FIG. 5 thereby creating a current in secondary 140. This flyback energy is transferred to node 172 via transformer 170 where it creates a decreasing voltage that is applied to the non-inverting input of integrating amplifier 440. During the next interval when the drive signal is in the −V state, magnetometer 110 is again driven into saturation as shown by the curve between points E and F in FIG. 5. During this interval, the voltage at terminal 172 is decreasing and is coupled to the inverting input of integrating amplifier 440. During the final interval when the drive signal is again in a high impedance state, the energy stored in magnetometer 110 flies back as shown by the curve between points F and C in FIG. 5 thereby creating a current in secondary 140. This flyback energy is transferred to terminal 172 via transformer 170 where it creates an increasing voltage that is applied to the non-inverting input of integrating amplifier 440.

As those skilled in the art will appreciate, the output of integrating amplifier 440 is indicative of the amplitude of the magnetic field component sensed by and parallel to the axis 112 of magnetometer 110. If the component of the magnetic field parallel to the sensing axis of magnetometer 110 is of zero amplitude, then the energy from the +V portion and the first high impedance portion of the drive signal (which represent the portion of the hysteresis curve to the right of the vertical axis) will balance the energy from the −V portion and the second high impedance portion of the drive signal (which represent the portion of the hysterisis curve to the left of the vertical axis) and the output of amplifier 440 will be, on average, a signal at zero volts (i.e., ground). If this component of the magnetic field is non-zero, then the hysterisis curve will not be balanced about the vertical axis and the output of amplifier 440 will correspondingly shift away from ground.

The output of integrating amplifier 440 is filtered by anti-aliasing filter 450 and is then converted to a digital signal by converter 460. Anti-aliasing filter 450 is preferably implemented as a low pass filter and removes A.C. ripple from the output of amplifier 440. The digital output of converter 460 is then applied to microprocessor 410 which generates an output signal 470 indicative of the amplitude of the magnetic field surrounding magnetometer 110.

Figure 6A:
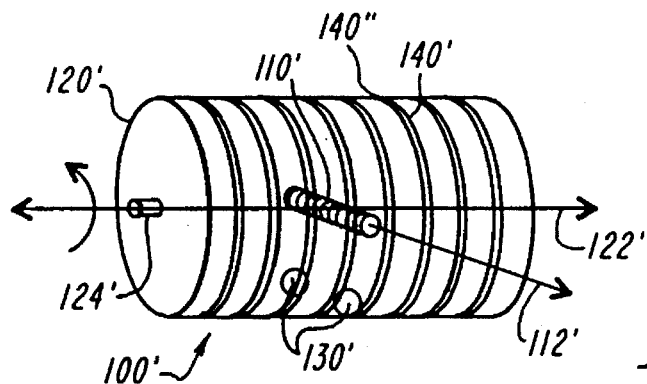
FIG. 6A is a perspective view of an alternative embodiment according to the invention of the platform shown in FIGS. 1A–C.
Figure 6B:
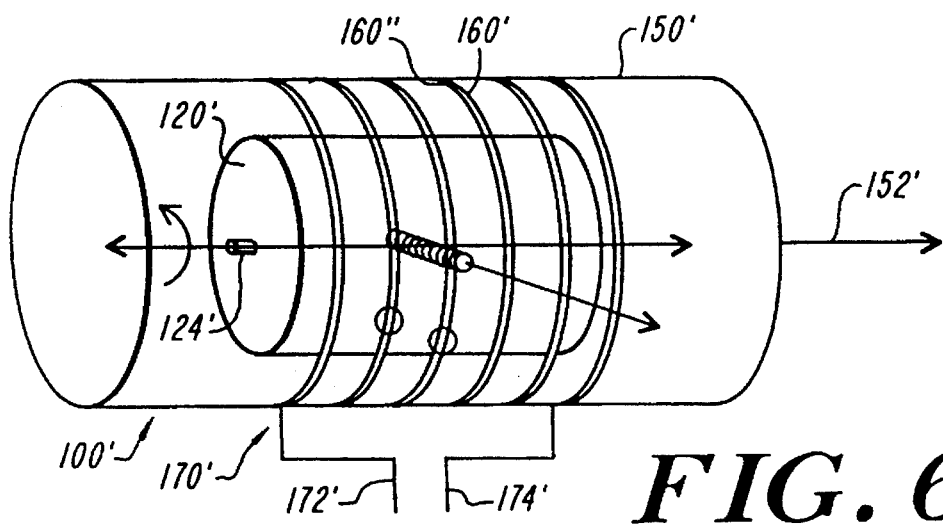
FIG. 6B is a perspective view of an alternative embodiment according to the invention of the system shown in FIG. 2.
Figure 6C:
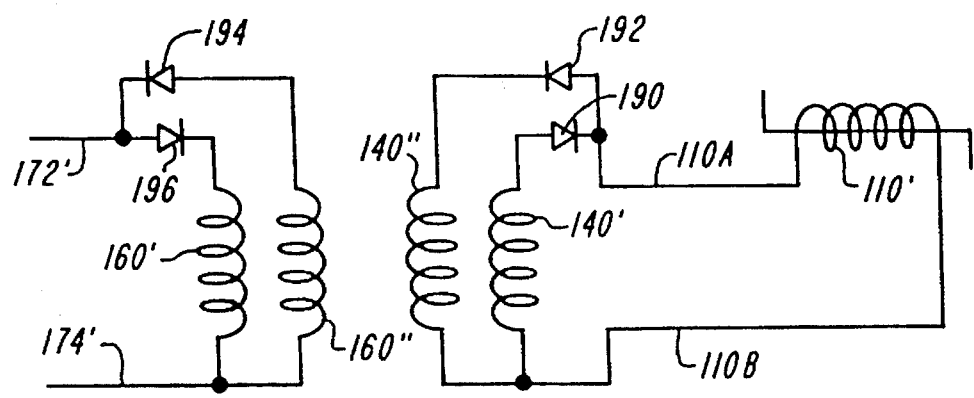
FIG. 6C is a schematic of the circuit formed by the coils and the magnetometer shown in FIG. 6B.

FIGS. 6A, 6B, and 6C illustrate a system 100', which is constructed in a fashion that is similar to system 100 of FIGS. 1A–C. As will be discussed in greater detail below, system 100' is useful in connection with compasses and other instruments in which two or more magnetometers are placed in close proximity. In such instruments, magnetometers are often placed in close proximity to facilitate reducing the overall size of the instrument. As discussed in the above-referenced U.S. Pat. No. 5,170,566, magnetometers placed in close proximity can magnetically interfere with each other. System 100' provides the ability to drive a magnetometer to zero balance thereby preventing the balanced magnetometer from generating a field when no drive signal is applied so that the balanced magnetometer will not magnetically interfere with any other magnetometers in close proximity. System 100' is also preferred, even in systems which do not place magnetometers in close proximity, because driving a magnetometer to zero balance allows the magnetometer to operate in a more linear fashion.

As shown in FIG. 6A, in system 100', two coils 140' and 140", which are electrically insulated from one another, are wound together around platform 120' (rather than a single coil 140 as in system 100). Similarly, as shown in FIG. 6B, two coils 160' and 160", which are electrically insulated from one another, are wound together around frame 150' (rather than a single coil 160 as in system 100). Magnetometer 110' is fixed within platform 120', as previously described, and gimbal bearings 124' mount platform 120' within frame 150' such that platform 120' can freely rotate about roll axis 122' in a similar manner as previously described. Additional weight, in the form of counterweights 130' maintain magnetometer 110' in a horizontal orientation. FIG. 6C is a schematic of the electrical circuit formed by coils 140', 140", 160', 160", and magnetometer 110'. A diode 190 is coupled in series with coil 140', between nodes 110A and 110B, and a diode 192 is coupled in series with coil 140" between nodes 110A and 110B. Diode 190 has its cathode and anode connected so as to permit current to flow through coil 140' in a direction from node 110B towards node 110A, and diode 192 has its cathode and anode connected so as to permit current to flow through coil 140" in a direction from node 110A towards 110B. Magnetometer 110' is coupled between nodes 110A and 110B and is physically oriented perpendicular to coils 140' and 140". Diodes 190, 192 thus establish a uni-directional current flow path between coil 140' and magnetometer 110', and an oppositely oriented uni-directional current flow path between coil 140" and magnetometer 110'. In a similar fashion, a diode 194 is coupled in series with coil 160" between terminals 172' and 174', and a diode 196 is coupled in series with coil 160' between terminals 172' and 174'. Diode 194 has its cathode and anode connected so as to permit current to flow through coil 160" in a direction from terminal 174' towards 172', and diode 196 has its cathode and anode connected so as to permit current to flow through coil 160' in a direction from terminal 172' towards terminal 174'. Diodes 194, 196 thus establish a uni-directional current flow path through coil 160' and an oppositely oriented uni-directional current flow path through coil 160". As those skilled in the art will appreciate, diodes 190, 192, 194, 196 may alternatively be implemented as switches, field effect transistors (FETS), rectifiers, or the like.

Coils 140', 140", 160', and 160" are wound such that they create four transformers: one including coils 140' and 160', one including coils 140' and 160", one including coils 140" and 160', and one including coils 140" and 160". Preferably, the coils are wound such that the coupling coefficient K1 between coils 160' and 140' equals the coupling coefficient between coils 140" and 160". Also preferably, the coils are wound such that the coupling coefficient K2 between coils 140' and 160" equals the coupling coefficient between coils 140" and 160'. Also preferably, the coupling coefficient K1 is greater than K2.

System 100', in addition to passing an A.C. signal from terminals 172', 174' to magnetometer 110', allows a D.C. bias signal, applied to terminals 172', 174', to pass to magnetometer 110'. As those skilled in the art will appreciate and as described in U.S. Pat. No. 5,170,566, this D.C. bias signal can be used to drive magnetometer 110' to a null balance, effectively making magnetometer 110' appear non-magnetic to any other magnetometers in close proximity, and insuring a more linear operation of magnetometer 110.

Figure 7:
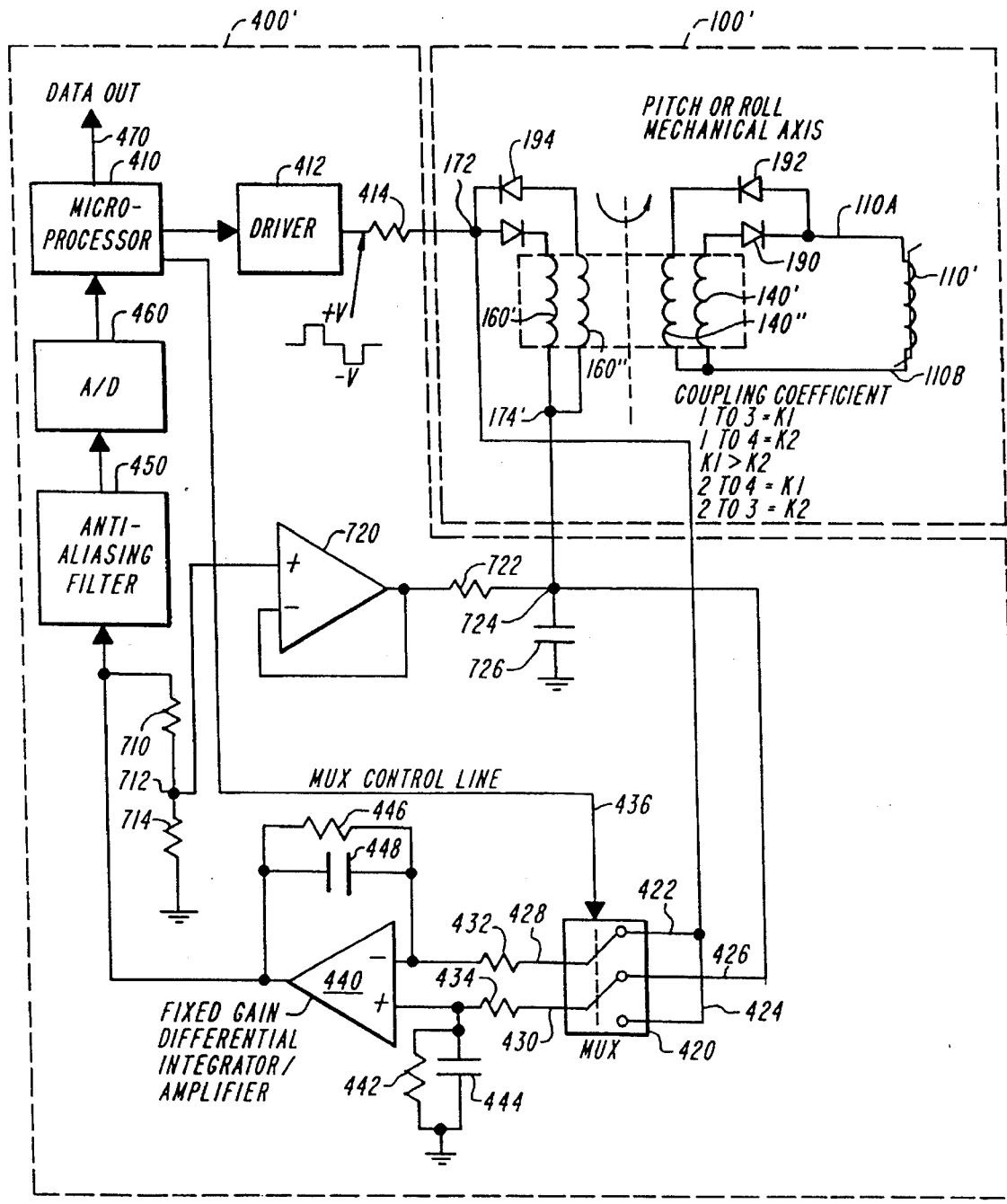
FIG. 7 is a schematic of a sensing circuit according to the invention for use in connection with the system shown in FIG. 6B for measuring the amplitude of a component of the earth's magnetic field and for driving the magnetometer to a null balance.

FIG. 7 is a schematic of one preferred sensing circuit 400' for use in conjunction with system 100' for measuring the strength of the Y component $H_y$ of the earth's magnetic field while driving magnetometer 110' to a null balance. Circuit 400' is configured similarly to circuit 400 (shown in FIG. 4), but is modified to be connected to terminals 172' and 174' of system 100'. The output of integrating amplifier 440 is, in addition to being coupled to anti-aliasing filter 450, coupled through resistor 710 to a node 712. Another resistor 714 is coupled between node 712 and ground. Node 712 is also coupled to the input of a sample and hold circuit which preferably is implemented using an operational amplifier 720. The non-inverting input of amplifier 720 is coupled to node 712, and the inverting input of amplifier 720 is coupled by a feedback path to the output of amplifier 720. The output of amplifier 720 is additionally coupled through resistor 722 to a node 724. A capacitor 726 is coupled between node 724 and ground, and node 724 is coupled to terminal 426 of switch 420 and to terminal 174' of system 100'. Terminal 172' is coupled to driver 412 via resistor 414. Terminal 172' is also coupled to terminals 422 and 424 of switch 420.

The operation of circuit 400' is similar to that of circuit 400 discussed above in connection with FIG. 4 except that a D.C. bias signal is applied to the magnetometer 110'. Microprocessor 410 applies a signal to driver 412 causing driver 412 to generate at its output a drive signal that is a periodic A.C. square wave signal which in one period transitions sequentially from a positive D.C. voltage state +V, to a high impedance state, to a negative D.C. voltage state −V, to a high impedance state. Microprocessor 410 controls switch 420 synchronously with the drive signal generated by driver 412 such that when the drive signal is in either the positive voltage state +V or the negative voltage state −V, the switch is in the forward state (as shown in FIG. 7) and switch 420 couples node 172' to the inverting input of amplifier 440 via resistor 432 and couples the non-inverting input of amplifier 440 to node 724 via resistor 434. Microprocessor 410 further controls switch 420 such that when the drive signal is in the high impedance state, switch 420 is in the flyback state and couples the inverting input of amplifier 440 to node 724 via resistor 432 and couples the non-inverting input of amplifier 440 to node 172' via resistor 434.

The voltage at node 724 is referred to as $V_{bias}$. When $V_{bias}$ is at ground level, the operation of sensing circuit 400' is substantially similar to that of circuit 400. When $V_{bias}$ is at ground level, the drive signal applied to coils 160', 160" (i.e., the voltage between nodes 172' and 174') is a waveform that is symmetric about ground level and alternates between +V and −V (with intermediate high impedance states).

As in circuit 400, integrating amplifier 440 generates a signal at its output representative of the amplitude of the magnetic field component sensed by magnetometer 110'. The output of amplifier 440 is applied to resistors 710 and 714 which form a voltage divider and generate a voltage signal at node 712. This voltage signal is applied to the non-inverting input of amplifier 720 which generates via resistor 722 a bias signal at node 724 and drives $V_{bias}$ away from ground level. When $V_{bias}$ is not at ground the drive signal applied to coils 160', 160" is a waveform that is not symmetric about ground level and alternates between a $(+V+V_{bias})$ level and a $(-V+V_{bias})$ level. In other words, the drive signal becomes an A.C. signal with a D.C. bias.

Due to the selection of coupling coefficients K1 and K2 as described above, this non-symmetric waveform applied to terminals 172', 174' generates an A.C. signal with a D.C. bias at magnetometer 110'. Referring to FIGS. 6C and 7, the generation of this biased signal will now be discussed. There is a positive transition and a negative transition associated with a single $(+V+V_{bias})$ pulse of the drive signal. During the positive transition the drive signal changes from a high impedance state to a $(+V+V_{bias})$ state, and during the negative transition the drive signal changes from a $(+V+V_{bias})$ state to a high impedance state. The positive transition causes a change in the current flowing through coil 160' which via inductive coupling causes a current to flow through coil 140' which is proportional to K1. The negative transition also causes a change in the current flowing through coil 160' which via inductive coupling causes a current to flow through coil 140" which is proportional to K2. Since K1 was chosen to be larger than K2, the currents caused by the positive and negative transitions are not equal (as would ordinarily be the case for an inductive coupling), and the $(+V+V_{bias})$ pulse of the drive signal generates a net current through magnetometer 110'. The $(-V+V_{bias})$ pulse similarly generates a net current flow through magnetometer 110' that flows in the opposite direction as the current caused by the $(+V+V_{bias})$ pulse. If equals zero, then these net currents balance and magnetometer 110' is driven by an A.C. signal. However, if $V_{bias}$ is non-zero then the net currents do not balance and an A.C. signal with a D.C. bias is applied to magnetometer 110'. The amplitude of the D.C. bias at magnetometer 110' is controlled by the level of $V_{bias}$.

Resistors 710 and 714 are chosen so that amplifier 720 generates a $V_{bias}$ signal that drives magnetometer 110' to null balance. In the preferred embodiment, resistors 710 and 714 are chosen so that they form a voltage divider, and amplifier 440 has a large gain. In an alternative embodiment, amplifier 440 has a lower gain and resistors 710 and 714 are not used. In this embodiment, the output of amplifier 440 drives the sample and hold circuit directly. However, in this embodiment, microprocessor 410 is driven by smaller level signals and therefore does not provide as accurate a measurement of the magnetic field. So in the preferred embodiment, resistors 442 and 446 are both chosen to be large or even infinite (i.e., the resistors may simply be removed) so that amplifier 440 has a large gain.

System 100' has been discussed in connection with a particular choice for the coupling coefficients of the four transformers formed by coils 140', 140", 160', and 160" (i.e., K1 and K2). As those skilled in the art will appreciate, system 100' will also function for other choices of the coupling coefficients.

Figure 8:
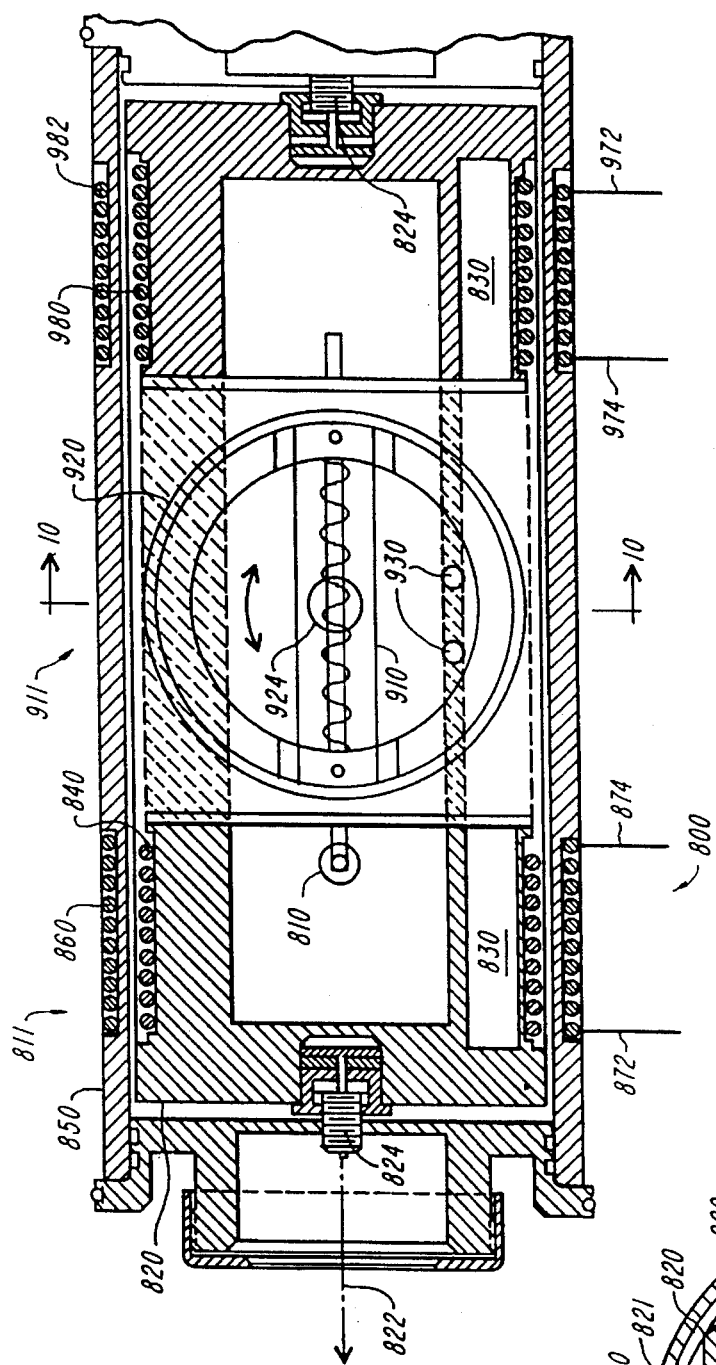
FIG. 8 is a cross-sectional, radial view of a fluxgate compass constructed according to the invention, having an X axis system and a Y axis system for measuring respectively, the X axis component $H_x$ and the Y axis component $H_y$ of the Earth's magnetic field.
Figure 9:
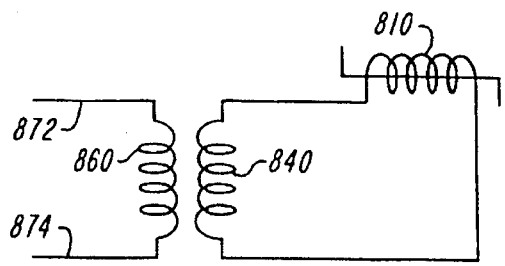
FIG. 9 is a schematic view of the electrical components of the Y axis system of the compass shown in FIG. 8.

FIG. 8 is a cross sectional radial view of a preferred two axis fluxgate compass 800 constructed according to the invention. Compass 800 includes a cylindrical roll platform 820 that is mounted within and coaxial with an outer cylindrical frame 850 by gimbal bearings 824 axially spaced apart from one another such that platform 820 may freely rotate about a roll axis 822 within frame 850. Preferably, the space between frame 850 and platform 820 is filled with a fluid such that platform 820 is neutrally buoyant. A magnetometer 810 is mounted within platform 820 such that its sensing axis, referred to herein as the Y axis, is perpendicular to and intersects roll axis 822. Gravity acts on one or more counterweights 830 that are mounted within platform 820 such that magnetometer 810 is maintained in a horizontal orientation. In FIG. 8, the orientation of magnetometer 810, and thus the Y axis, is normal to the plane of the page. Magnetometer 810 is electrically coupled in parallel with a coil 840 that is wound around one portion of the cylindrical surface of cylindrical platform 820 in a direction that is preferably perpendicular to the windings around magnetometer 810. A second coil 860 is wound around at least a portion of the cylindrical surface of cylindrical frame 850 such that coils 860 and 840 form a transformer. Coil 860 terminates in two terminals 872, 874. FIG. 9 is a schematic of the circuit formed by coils 840, 860 and magnetometer 810 and is identical to that shown in FIG. 3. Terminals 872, 874 provide electrical access to primary coil 860, primary coil 860 is inductively coupled to secondary coil 840, and secondary coil 840 is electrically coupled in parallel with magnetometer 810. Any magnetic coupling between magnetometer 810 and the coils 840 and 860 will be minimized by the 90° orientation of the former to the latter. As those skilled in the art will appreciate, as thus far described compass 800 is similar to system 100 and terminals 872, 874 may be coupled to a circuit similar to that shown in FIG. 4 which uses magnetometer 810 to measure the Y component $H_y$ of the earth's magnetic field. Coils 840, 860 and magnetometer 810 can be thought of as forming a system 811 useful for measuring the Y component $H_y$ of the Earth's magnetic field.

Figure 10:
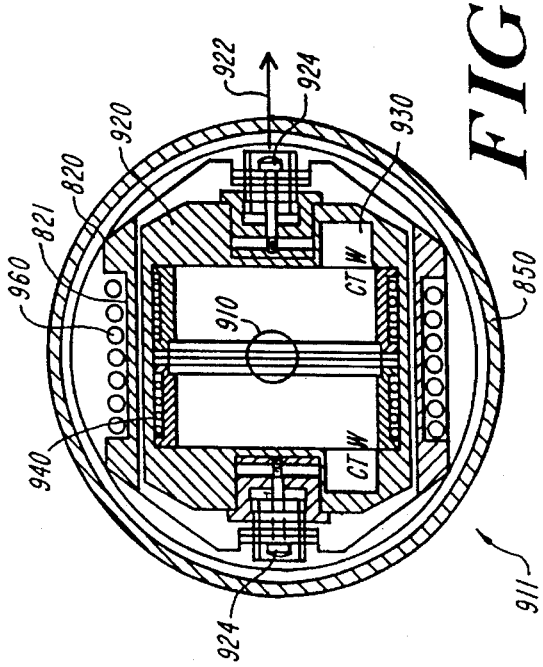
FIG. 10 is a cross-sectional axial view of the compass shown in FIG. 8 taken along line 10—10 of FIG. 8.

Compass 800 additionally contains a system 911 for measuring the X component $H_x$ of the earth's magnetic field where the X axis is taken to have a horizontal orientation and to be normal to the Y axis. FIG. 10 is a cross sectional view of the X axis system 911 taken in the direction indicated by line 10—10 in FIG. 8. Referring to FIGS. 8 and 10, the X axis system 911 contains a magnetometer 910 that is mounted within a platform 920. Platform 920 is mounted within platform 820 by gimbal bearings 924 (seen in FIG. 10) such that platform 920 may freely rotate within platform 820 about a pitch axis 922. Preferably, the space between platform 820 and platform 920 is filled with a fluid such that platform 920 is neutrally buoyant. Gravity acts on one or more counterweights 930 that are mounted within platform 920 such that magnetometer 910 is maintained in a horizontal orientation. Further, when compass 800 is in a level orientation (i.e., zero degrees of pitch angle), as shown in FIG. 8, the X axis is coincident with roll axis 822, and the X axis intersects magnetometer 810. If the pitch angle of compass 800 is varied, the X axis will no longer intersect magnetometer 810, and magnetometer 910 will rise above or fall below magnetometer 810, but in any case, both magnetometers 810, 910 will remain in a horizontal orientation.

Figure 11:
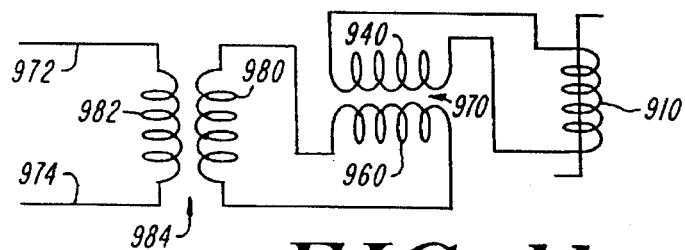
FIG. 11 is a schematic of the electrical components of the X axis system of the compass shown in FIG. 8.

Magnetometer 910 is electrically coupled in parallel with a coil 940 (shown in FIG. 10) which is wound around at least a portion of the cylindrical surface of cylindrical platform 920, preferably in a direction that is perpendicular to the direction of the windings around magnetometer 910. Another coil 960 (shown in FIG. 10 but not FIG. 8) is wound around a recess 821 in platform 820 such that coils 960 and 940 form a transformer. Coil 960 is electrically coupled in parallel with another coil 980 (the latter shown in FIG. 8) that is wound around at least a portion of the cylindrical surface of platform 820. Coil 980 is wound in a direction that is perpendicular to the windings of coil 960. Another coil 982 (shown in FIG. 8) is wound around at least a portion of the cylindrical surface of frame 850 such that coils 980 and 982 form a transformer. Coil 982 terminates in two terminals 972 and 974. FIG. 11 is a schematic of the circuit formed by magnetometer 910 and coils 940, 960, 980 and 982. Terminals 972, 974 provide electrical access to coil 982 which forms the primary of a transformer 984. Coil 980, which forms the secondary of transformer 984, is electrically coupled in parallel with coil 960 which forms the primary of a transformer 970. Coil 940 which forms the secondary of transformer 970 is electrically coupled in parallel with magnetometer 910. Transformers 970, 984 do not electromagnetically interfere with each other since the coils of the two transformers are wound perpendicular to each other. Coils 840, 860, 980, and 982 are spaced apart from, and therefore do not electromagnetically interface with, magnetometer 910, however, complete isolation is not necessary since the air core transformers primarily carry A.C. signals. Terminals 972, 974 may be connected to a sensing circuit similar to that shown in FIG. 4 which uses magnetometer 910 to measure the X component $H_x$ of the horizontal component of the earth's magnetic field.

In compass 800, of FIGS. 8 and 10, system 811 provides a means for measuring the Y component $H_y$ of the earth's magnetic field, and system 911 provides means for measuring the X component $H_x$. As those skilled in the art will appreciate, a single microprocessor (such as microprocessor 410 shown in FIG. 4) may use these measured values of $H_x$ and $H_y$ to calculate an indication of heading.

Figure 1C:
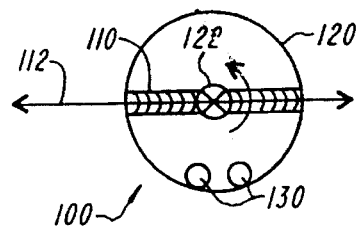
Figure 1C:
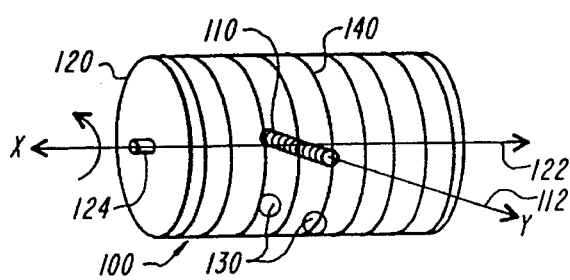
Figure 12:
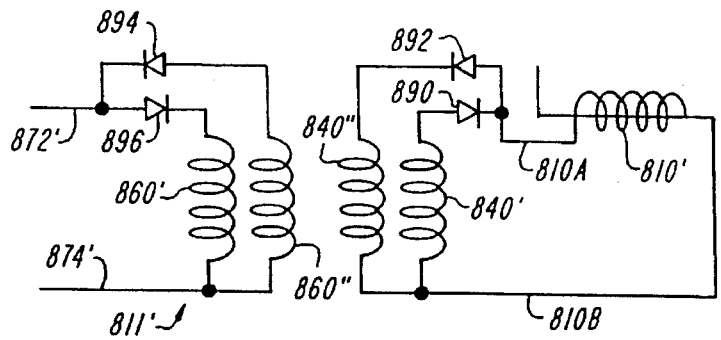
FIG. 12 is a schematic of the electrical components of an alternative embodiment of the Y axis system of the compass shown in FIG. 8.

As thus far described, the arrangement of magnetometer 810 and coils 840 and 860 (shown in FIG. 9) for measuring the Y axis component $H_y$ is similar to system 100 (shown in FIGS. 1–3). In an alternative embodiment shown in FIG. 12, compass 800 uses a system 811' to measure the Y axis component $H_y$. System 811' is implemented in a fashion that is similar to system 100' (shown in FIGS. 6A–C). In system 811', coils 860, 840 are each implemented as two coils with associated diodes. Coil 840 (which is wrapped around at least a portion of the cylindrical surface of platform 820) is implemented as two coils 840', 840". Coil 840' is coupled in series with diode 890, and coil 840" is coupled in series with diode 892. Coil 840' and diode 890 are coupled between nodes 810A and 810B, as are coil 840" and diode 892. Diode 890 has its anode and cathode connected to allow current to flow through coil 840' in a direction from node 810B towards 810A, and diode 892 has its anode and cathode connected to allow current to flow through coil 840" in a direction from node 810A towards 810B. Magnetometer 810' is electrically coupled between nodes 810A, 810B. Coil 860 (which is wrapped around at least a portion of the cylindrical surface of frame 850) is implemented as two coils 860', 860". Coil 860' is coupled in series with a diode 896 and coil 860" is coupled in series with a diode 894. Coil 860' and diode 896 are coupled between terminals 872', 874', as are coil 860" and diode 894. Diode 896 has its anode and cathode connected to allow current to flow through coil 860' in a direction from terminal 872' towards terminal 874', and diode 894 has its anode and cathode connected to allow current to flow through coil 860" in a direction from terminal 874' towards 872'. Preferably, the coils are wound such that the coupling coefficient K1 between coils 860' and 840' is equal to the coupling coefficient between coils 860" and 840". Similarly, the coupling coefficient K2 between coils 860' and 840" is equal to the coupling coefficient between coils 860" and 840'. Also preferably, the value of K1 is greater than the value of K2. Terminals 872', 874' may be connected to a sensing circuit similar to that shown in FIG. 7 which uses magnetometer 810' to measure the Y component $H_y$ of the earth's magnetic field. Further, this circuit while measuring $H_y$ drives magnetometer 810' to null balance so that magnetometer 810' does not magnetically interfere with magnetometer 910 as described in U.S. Pat. No. 5,170,566 mentioned above, and improves the linearity of the measurement of the magnetic field.

Figure 13:
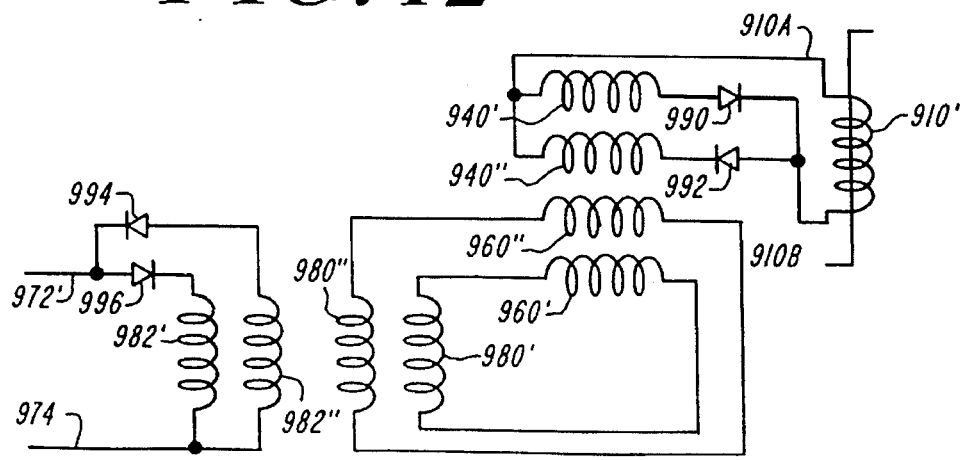
FIG. 13 is a schematic of the electrical components of an alternative embodiment of the X axis system of the compass shown in FIG. 8.

Similarly, in an alternative embodiment shown in FIG. 13, compass 800 uses a system 911' to measure the X axis component $H_x$. System 911' is constructed in a fashion that is similar to system 100'. Specifically, coils 940, 960, 980, 982 are each implemented as two coils with associated diodes. Coil 940 (which is wound around at least a portion of the cylindrical surface of platform 920) is implemented as two coils 940', 940". A diode 990 is coupled in series with coil 940', and a diode 992 is coupled in series with coil 940". Coil 940' and diode 990 are coupled between nodes 910A, 910B, as are coil 940" and diode 992. Diode 990 has its anode and cathode connected to allow current to flow through coil 940' in a direction from node 910B towards 910A, and diode 992 has its anode and cathode connected to allow current to flow through coil 940" in a direction from anode 910A towards 910B. Magnetometer 910' is electrically coupled between nodes 910A, 910B. Coil 960 (which is wound around a recess 821 in platform 820) is implemented as two coils 960', 960', and coil 980 (which is wound around a portion of the perimeter of platform 820) is implemented as two coils 980', 980". Coils 980' and 960' are coupled in a series loop, and coils 980" and 960" are coupled in another series loop. Coil 982 (which is wound around a portion of the perimeter of frame 850) is implemented as two coils 982', 982". Coil 982' is coupled in series with diode 996 and coil 982" is coupled in series with a diode 994. Coil 982' and diode 996 are coupled in series between terminals 972', 974', as are coil 982" and diode 994. Diode 996 has its anode and cathode connected to allow current to flow through coil 982' in a direction from terminal 972' to terminal 974', and diode 994 has its anode and cathode connected to allow current to flow through coil 982" in a direction from terminal 974' towards terminal 972'. Preferably, the coils are wound such that the coupling coefficients between coils 982' and 980', and between coils 960' and 940', and between coils 982" and 980", and between coils 960" and 940" are all equal to the same value K1. Similarly, the coupling coefficients between coils 982' and 980', and between coils 982" and 980', and between coils 960' and 940', and between coils 960" and 940' are all equal to the same value K2. Also preferably, the value of K1 is greater than the value of K2. Terminals 972', 974' may be connected to a circuit similar to that shown in FIG. 4 or FIG. 7 which uses magnetometer 910' to measure the X component $H_x$. Further, the circuit shown in FIG. 7 is preferred since this circuit, while measuring $H_x$, drives magnetometer 910' to null balance so that magnetometer 910' does not magnetically interfere with magnetometer 810 (or 810' if the Y axis system 811' is used) and allows the magnetometer to operate in a more linear fashion.

In the preferred embodiment, compass 800 uses system 811' to measure the Y axis component $H_y$, and uses system 911' to measure the X axis component $H_x$. This system is preferred because it offers greater accuracy since both magnetometers are driven to null balance, and therefore do not interfere with each other magnetically and allows the compass to operate in more linear fashion. However, other embodiments of compass 800 which use different combinations of systems 811, 811', 911, and 911' are also useful.

Figure 14:
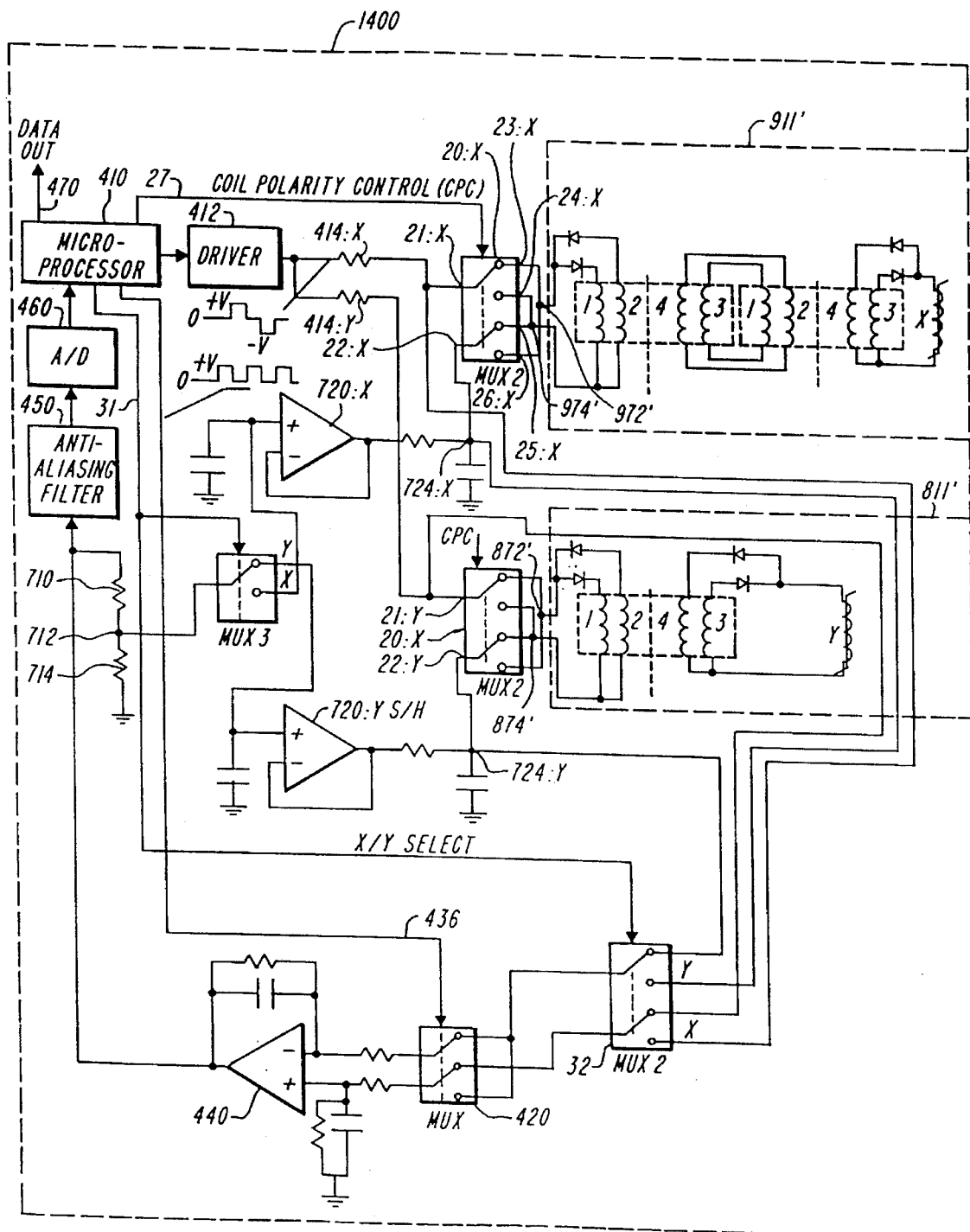
FIG. 14 is a schematic of a preferred two axis sensing circuit for use in conjunction with the compass shown in FIG. 8.

FIG. 14 is a schematic of a preferred sensing circuit 1400 for use in conjunction with compass 800 which includes X axis system 911' and Y axis system 811'. Circuit 1400 is a two-axis version of circuit 400' (shown in FIG. 7). Whereas circuit 400' used a single sample and hold circuit, circuit 1400' uses two sample and hold circuits. The X axis sample and hold circuit is implemented using an operational amplifier 720:X, and the Y axis sample and hold circuit is implemented using an operational amplifier 720:Y. The inputs of the X and Y sample and hold circuits are coupled by a switch 30 to node 712 of the voltage divider formed by resistors 710 and 714. The state of switch 30 is controlled by an output 31 of microprocessor 410 such that when microprocessor 410 is monitoring the Y axis system 811', microprocessor 410 controls switch 30 to couple node 712 to the non-inverting input of amplifier 720:Y, and when microprocessor 410 is monitoring the X axis system 911', microprocessor 410 controls switch 30 to couple node 712 to the non-inverting input of amplifier 720:X. A capacitor is coupled between the non-inverting input of amplifier 720:X and ground, and another capacitor is coupled between the non-inverting input of amplifier 720:Y and ground. These capacitors maintain the voltage on the non-inverting input of the amplifiers when switch 30 decouples the amplifiers from the node 712. The X and Y sample and hold circuits generate bias signals at nodes 724:X and 724:Y, respectively.

A double pole, double throw switch 32 is used to couple the X and Y axis systems, 911' and 811', to switch 420. The state of switch 32 is controlled by the same output 31 of microprocessor 410 that controls switch 30, such that when microprocessor 410 is monitoring the X axis system 911', switch 32 couples the terminals of the X axis system 911' to the terminals of switch 420, and when microprocessor 410 is monitoring the Y axis system 811', switch 32 couples the terminals of the Y axis system 811' to the terminals of switch 420.

Circuit 1400 uses a double pole, double throw switch 20:X to couple driver 412 to the X axis system 911', and in a similar configuration uses a double pole, double throw switch 20:Y to couple driver 412 to the Y axis system 811'. For convenience, only the configuration and operation of the X axis switch 20:X will be described in detail, however, those skilled in the art will appreciate that switch 20:Y is configured and is operated in a similar manner. The output of driver 412 is coupled to two resistors 414:X and 414:Y, the other terminals of which are coupled to terminals 21:X and 21:Y of switches 20:X and 20:Y, respectively so that driver 412 may continuously excite both the X and Y axis systems. A terminal 22:X of switch 20:X is coupled to the bias signal at node 724:X. Terminals 23:X and 26:X of switch 20:X are both coupled to terminal 972' of system 911', and terminals 24:X and 25:X of switch 20:X are both coupled to terminal 974' of system 911'.

The state of switches 20:X and 20:Y is controlled by an output 27 of microprocessor 410. In one state, switch 20:X couples terminal 972' to driver 412 via resistor 414:X and couples terminal 974' to the bias signal at node 724:X. In the other state, switch 20:X reverses these connections and couples terminal 972' to the bias signal at node 724:X and couples terminal 974' to the driver 412 via resistor 414:X. Changing the state of switch 20:X therefore reverses the polarity of the drive signal applied to system 911'. Ideally, system 911' will produce an output of equal magnitude and opposite polarity in response to such reversal, however, offsets in system components, due for example to changes or variations in temperature, or mismatch of component values, may cause system 911' to generate outputs which are not equal in magnitude. In the preferred system, microprocessor 410 changes the state of switch 20:X with a frequency substantially slower than the frequency of the drive signal and averages the results to compensate for any such offsets. In one preferred system, microprocessor 410 monitors the output of system 911' for approximately 10 cycles of the drive cycle and then changes the state of switch 20:X and monitors the output of system 911' for approximately another ten cycles of the drive signal. Microprocessor 410 then averages the two monitored outputs from system 911' to compensate for any system offsets. As those skilled in the art will appreciate, a double pole, double throw switch such as switch 20:X may also be used to cancel offsets in the single axis configurations described in connection with FIGS. 4 and 7.

In operation, microprocessor 410 alternates between monitoring the X and Y axis systems. Microprocessor 410 monitors the X axis system by coupling terminals 972', 974' to the inputs of integrating amplifier 440 for several cycles of the drive signal, and by simultaneously coupling the output of amplifier 440 to the input of the X axis sample and hold circuit. Once microprocessor 410 has measured the output of the X axis system 911' and has established a bias signal at node 724:X appropriate for driving the magnetometer of the X axis system to null balance, microprocessor 410 changes the state of switches 32 and 30 so as to couple terminals 872', 874' to the inputs of amplifier 440 and to couple the output of amplifier 440 to the input of the Y axis sample and hold circuit. Microprocessor 410 thereby monitors the Y axis system and establishes a bias signal at node 724:Y appropriate for driving the magnetometer of the Y axis system to null balance.

Sensing circuit 1400 has been described in connection with a compass 800 which uses systems 811' and 911'. As those skilled in the an will appreciate, a similar sensing circuit may be used in connection with a compass 800 which uses systems 811 and 911 (as described in connection with FIGS. 9 and 11). Such a sensing circuit could be simplified, for example, by eliminating the sample and hold circuits.

Figure 15:
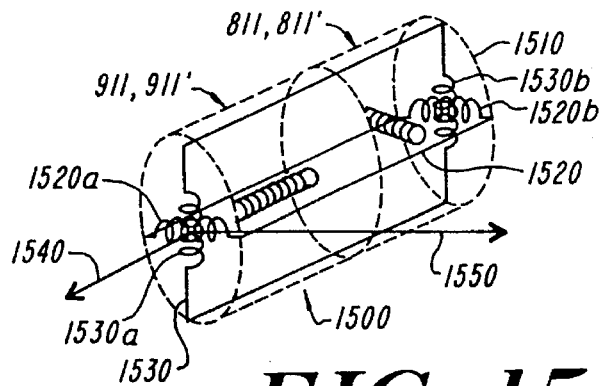
FIG. 15 is a perspective view of a two axis attitude sensor constructed according to the invention.

FIG. 15 is a perspective view of a compass 1500 which is constructed similarly to compass 800 and additionally includes a device for sensing the pitch and roll angles of the sensor. In compass 1500, a frame (similar to frame 850 shown in FIGS. 8 and 10 but not shown in FIG. 15) supporting the magnetometers and sensing coils is mounted within an outer cylindrical casing 1510. Two excitation coils 1520, 1530 are wound around casing 1510 so that coils lie in planes normal to one another as described in U.S. Pat. No. 5,170,566. Coil 1520, which is referred to as the cosine coil, includes two coils 1520a, 1520b which are coupled in series and are disposed at opposite ends of the compass such that both coils 1520a, 1520b are parallel to a pitch axis 1550 of the sensor. Coil 1530, which is referred to as the sine coil, includes two coils 1530a, 1530b which are coupled in series and are disposed at opposite ends of the compass such that both coils 1530a, 1530b are orthogonal to pitch axis 1550 and to a roll axis 1540. Compass 1500 contains either system 911 or 911' for measuring the X axis component $H_x$, and contains either system 811 or 811' for measuring the Y axis component $H_y$ of the earth's magnetic field. Sensor 1500 also contains a circuit card (not shown) mounted within casing 1510 containing a circuit for monitoring the X and Y axis systems as well as for selectively energizing coils 1520, 1530. As those skilled in the art will appreciate, and as will be discussed further below, by monitoring the X and Y axis systems while coils 1520 and 1530 are selectively energized with equal and opposite drive currents, it is possible to measure the pitch and roll angles of the sensor 1500, where the pitch angle is defined as the angle between roll axis 1540 and the horizontal plane, and where the roll angle is defined as the angle between pitch axis 1550 and the horizontal plane. Sensor 1500 provides an indication of heading as well as an indication of pitch and roll angles.

Figure 16:
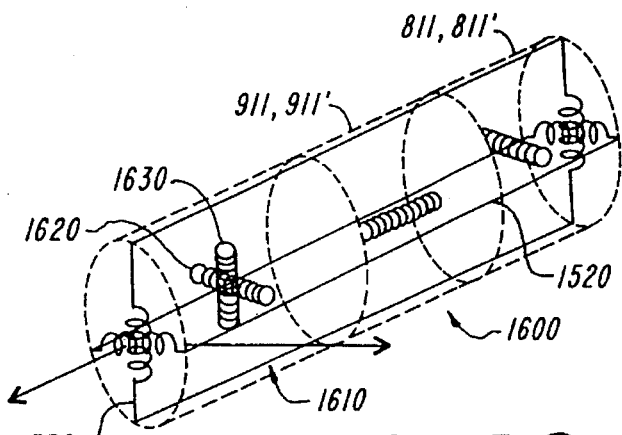
FIG. 16 is a perspective view of a three axis attitude sensor constructed according to the invention.

FIG. 16 illustrates a compass 1600 constructed according to the invention. Compass 1600 is similar to compass 1500 (shown in FIG. 15) however, compass 1600 additionally contains a section 1610 for measuring the vertical component Z of the earth's magnetic field. Section 1610 contains two orthogonally disposed magnetometers 1620, 1630 each of which is mounted in a plane that is perpendicular to the planes defined by the sine coil 1530 and the cosine coil 1520. Magnetometers 1620, 1630 are configured in a "strapped down" configuration, i.e., they are not supported by gimbals but are rather fixed to frame 850 (shown in FIG. 8). Magnetometers 1620, 1630 measure orthogonal components Z1, Z2, respectively, of the amplitude of the vertical component Z. As those skilled in the art will appreciate, the measurements of Z1 and Z2 may be combined to yield the amplitude of the vertical component Z. Compass 1600 additionally contains circuitry which uses magnetometers 1620, 1630 to measure the vertical component Z. As those skilled in the art will appreciate, compass 1600 can use the measured amplitude of the vertical component Z to generate correction terms so that the accuracy of the measurement of heading provided by compass 1600 does not vary with changes in latitude.

Figure 17:
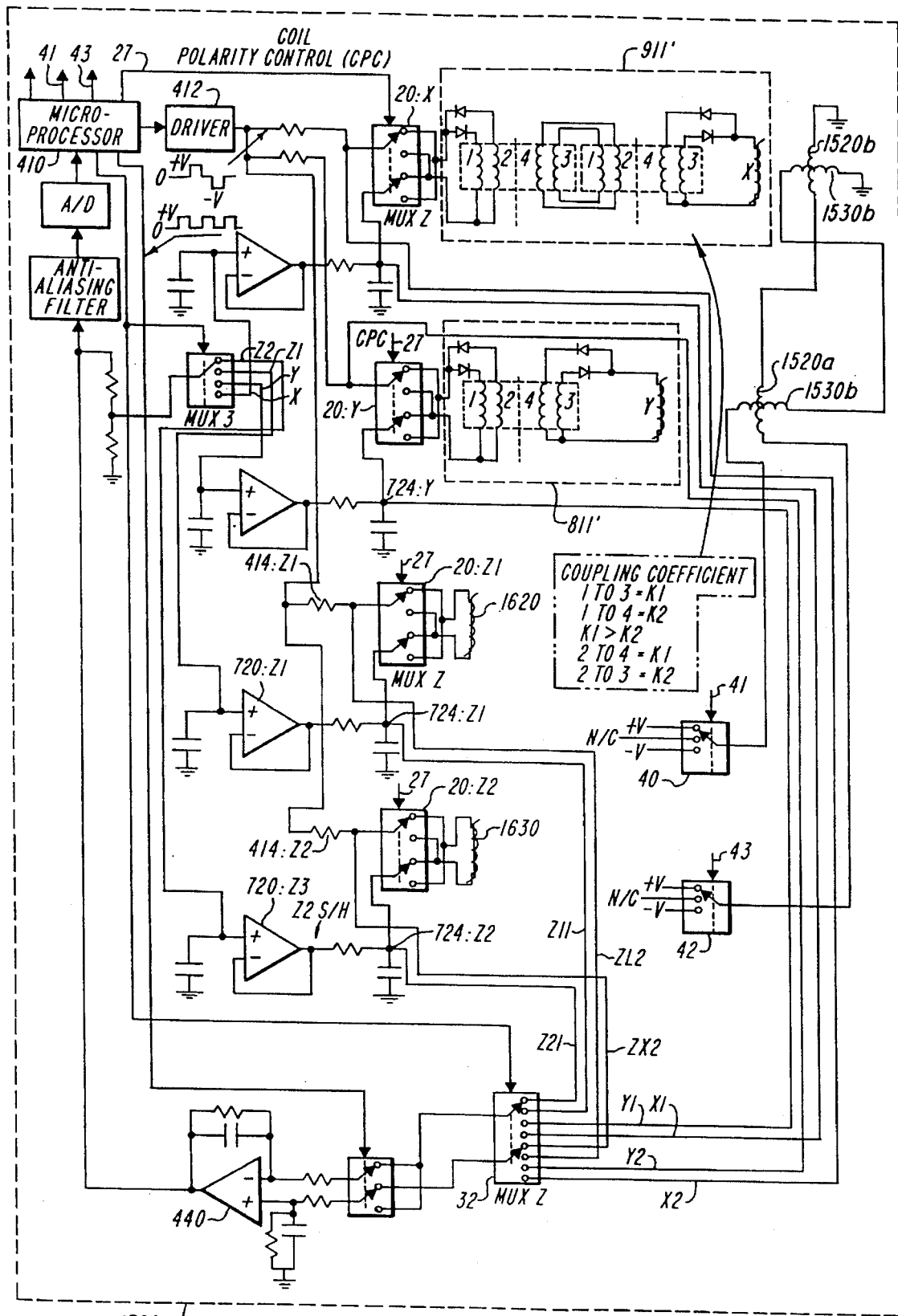
FIG. 17 is a schematic of a preferred sensing circuit for use in conjunction with the sensor shown in FIG. 16.

FIG. 17 is a schematic of a preferred sensing circuit 1700 for use in conjunction with compass 1600. Circuit 1700 is a three-axis version of circuit 1400 (shown in FIG. 14) and additionally contains magnetometers 1620, 1630 for measuring the Z1 and Z2 components. Magnetometer 1620 is coupled to driver 412 via a resistor 414:Z1 and a switch 20:Z1. Similarly, magnetometer 1630 is coupled to driver 412 via a resistor 414:Z2 and a switch 20:Z2. Circuit 1700 additionally contains sample and hold circuits for the Z1 and the Z2 magnetometers. The Z1 and Z2 sample and hold circuits are implemented using operational amplifiers 720:Z1 and 720:Z2, respectively. Amplifiers 720:Z1, 720:Z2 generate bias voltages at nodes 724:Z1, 724:Z2, respectively. Switch 30 is expanded to allow microprocessor 410 to couple node 712 to any of the X, Y, Z1, or Z2 sample and hold circuits. Switch 32 is similarly expanded to allow microprocessor 410 to couple either the X, Y, Z1 or Z2 magnetometers to amplifier 440. Circuit 1700 additionally contains switches 40 and 42 for selectively energizing the cosine coils 1520a, 1520b, and the sine coils 1530a, 1530b, respectively, for use in determining the pitch and roll angle of the compass 1600. Cosine coils 1520a and 1520b are coupled in series between an output of switch and ground, and sine coils 1530a and 1530b are coupled in series between an output of switch 40 and ground. Microprocessor 410 controls the state of switches 40 and 42 via control outputs 41 and 43, respectively. Switches 40 and 42 are configured such that microprocessor 410 may couple their output to either a positive voltage +V, a negative voltage –V, or an open circuit, where the magnitude of +V (i.e., |+V|) equals the magnitude of –V (i.e., |–V|).

As those skilled in the art will appreciate, the pitch and roll angles of compass 1600 are preferably determined by monitoring the outputs of the X and Y magnetometers as microprocessor 410 successively places the outputs of switches 40, 42 in the following four states: outputs of switches 40 and 42 coupled to +V and to open circuit, respectively; outputs of switches 40 and 42 coupled to –V and to open circuit, respectively; outputs of switches 40 and 42 coupled to open circuit and to +V, respectively; and outputs of switches 40 and 42 coupled to open circuit and to –V, respectively. Further, microprocessor 410 couples the outputs of both switches 40, 42 to open circuit when monitoring the X and Y axis systems to determine the X and Y components of the earth's magnetic field. In another embodiment that does not have a negative source for providing a –V voltage, switches 40 and 42 may only be coupled to either +V or ground, and two additional double pole double throw switches (not shown) are coupled between switches 40 and 42 and the sine and cosine coils. In this embodiment the additional double pole double throw switches are used to generate either a +V or a –V voltage across the coils as switches 40 and 42 are coupled to +V. This system insures that the magnitude of –V is equal to the magnitude of +V. As those skilled in the art will appreciate, such a system may also be used between driver 412 and the magnetometers to insure that the applied drive signal is a balanced signal.

Figure 18:
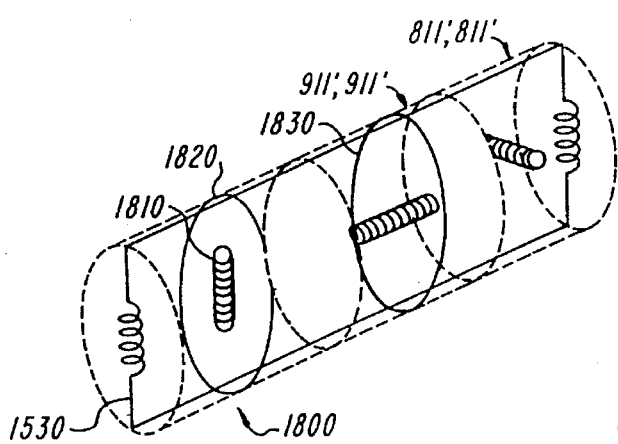
FIG. 18 is a perspective view of an alternate embodiment of a three axis attitude sensor constructed according to the invention.

FIG. 18 illustrates another compass 1800 constructed according to the invention. Compass 1800 is similar to compass 1600 (shown in FIG. 16), however, rather than having two strapped down magnetometers for measuring the vertical component Z, compass 1800 has a single magnetometer 1810 which is mounted within the compass in a double gimbaled arrangement similar to the arrangement used to mount the magnetometer of the X axis system 911', with the exception that magnetometer 1810 is mounted such that it is maintained in a vertical orientation. Compass 1800 uses a sine coil 1530 and does not use a cosine coil 1520. Compass 1800 has two additional excitation coils 1820, 1830 which are solenoidally wound around the Z and X axis magnetometers, respectively.

Compass 1600 (shown in FIG. 16) and compass 1800 are both preferred attitude sensors according to the invention. Compass 1600 is preferred because it is less expensive to construct than compass 1800, due in part to the simplified arrangement of the strapped down magnetometers, and compass 1800 is preferred because it provides a more accurate measurement of pitch and roll angles than does compass 1600.

Figure 19:
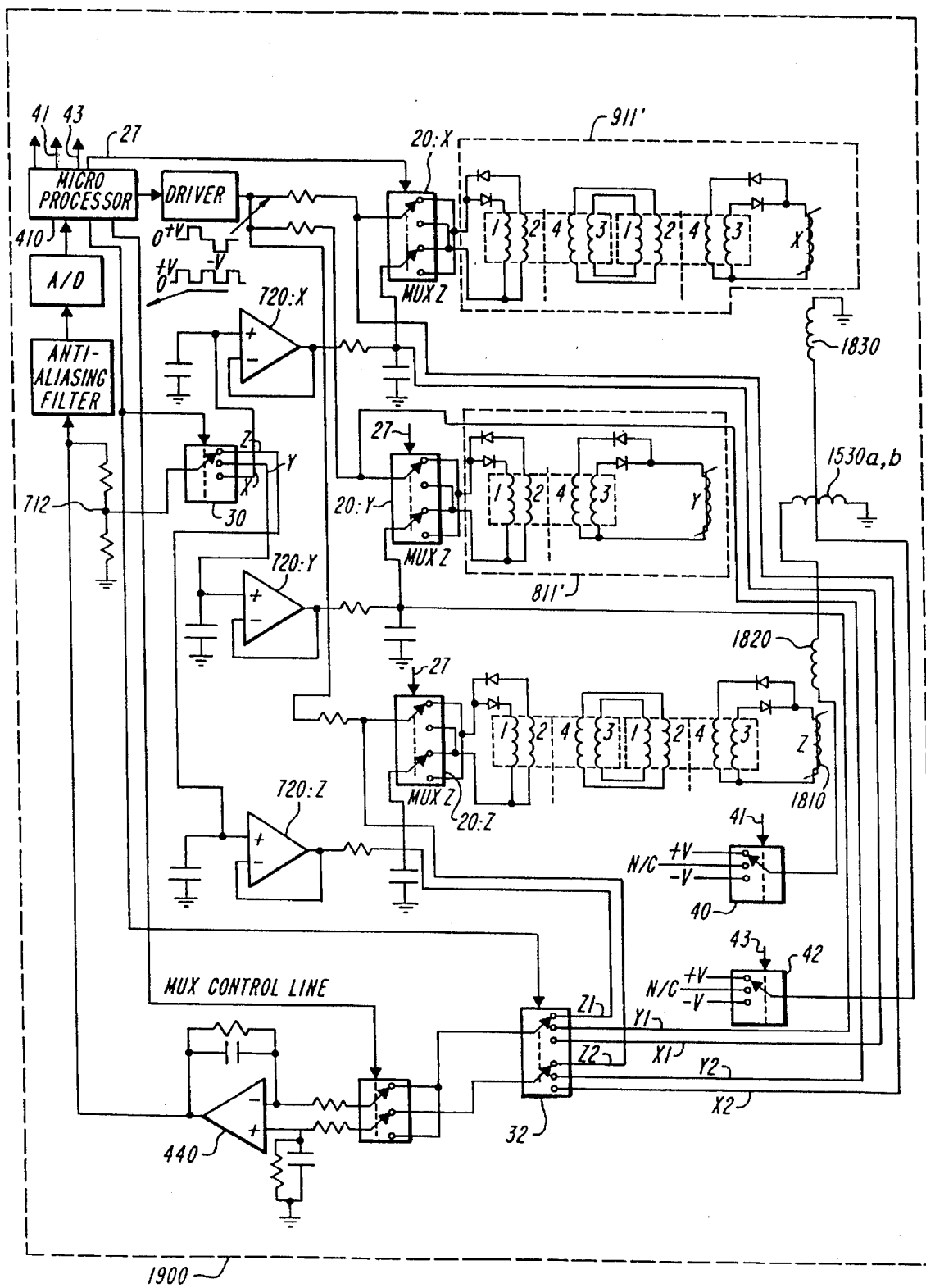
FIG. 19 is a schematic of a preferred sensing circuit for use in conjunction with the sensor shown in FIG. 18.

FIG. 19 is a schematic of a preferred sensing circuit 1900 for use in conjunction with compass 1800. The structure and operation of circuit 1900 are similar to that of circuit 1700 (shown in FIG. 17). As shown in FIG. 19, compass 1800 uses an arrangement similar to that of system 911' to couple the Z axis magnetometer 1810 to a switch 20:Z. The excitation coils are configured so that coil 1820 is coupled in series with sine coils 1530*a* and 1530*b* between the output of switch 40 and ground, and coil 1830 is coupled between the output of switch 42 and ground.

Figure 20:
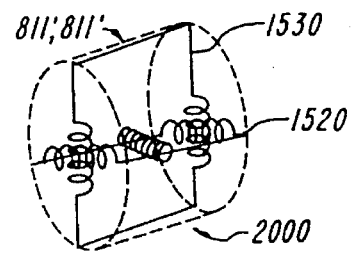
FIG. 20 is a perspective view of a one axis clinometer constructed according to the invention.

FIG. 20 is a perspective view of another device 2000 using a single magnetometer and constructed according to the invention. Device 2000 is a single axis sensor which uses either system 811 or 811' and two excitation coils 1520, 1530 to provide a measurement of roll angle. Such a sensor is useful as a single axis clinometer.

It should be appreciated that the term "magnetometer" generically refers to any type of two wire fluxgate magnetometer. Further, while the various embodiments have been described as, particularly useful in connection with fluxgate compasses for measuring a component or components of the earth's magnetic field, the system may also be used in other configurations for measuring a component of an arbitrary magnetic field.

Since certain changes may be made in the above apparatus without departing from the scope of the invention herein involved, it is intended that all matter contained in the above description or shown in the accompanying drawing shall be interpreted in an illustrative and not a limiting sense.

What is claimed is:

1. An apparatus for measuring the magnitude of at least one component of a magnetic field comprising:

sensing means including a first sensor for sensing a first component of the magnetic field;

first coupling means for inductively coupling said first sensor to a first port and for transferring a first electric signal between said first sensor and said first port, said first electric signal being representative of said first component.

2. An apparatus according to claim 1, further comprising:

signal processing means for processing said first electric signal.

3. An apparatus according to claim 1, further comprising:

means for supporting said first sensor so that said first sensor is pivotable about at least one pivot axis.

4. An apparatus according to claim 3, wherein said first coupling means comprises a transformer comprising two coils inductively coupled to one another.

5. An apparatus according to claim 4, wherein one of said coils is secured so as rotate with said first sensor about said pivot axis relative to the other of said coils.

6. An apparatus according to claim 5, wherein one of said coils is disposed within the other of said coils, said coils both being coaxial with said pivot axis.

7. An apparatus according to claim 1, wherein said sensing means further includes a second sensor for sensing a second component of the magnetic field, said second component being substantially perpendicular to said first component, said apparatus further comprising second coupling means for inductively coupling said second sensor to a second port and for transferring a second electric signal between said second sensor and said second port, said second electric signal being representative of said second component.

8. An apparatus according to claim 7, further comprising:

means for supporting said first and second sensors so that said first sensor is pivotable about at least a first pivot axis and said second sensor is pivotable about at least a second pivot axis normal to said first pivot axis.

9. An apparatus according to claim 8, wherein said second coupling means includes at least one transformer comprising two coils inductively coupled to one another.

10. An apparatus according to claim 9, wherein one of said coils of said second coupling means is secured so as to rotate with said second sensor about said second pivot axis relative to the other coil of said second coupling means.

11. An apparatus according to claim 10, wherein one of said coils of said second coupling means is disposed within the other of said coils of said second coupling means, said coils of said second coupling means both being coaxial with said second pivot axis.

12. An apparatus according to claim 7, said first coupling means comprising a transformer including two coils inductively coupled to one another, and said second coupling means comprising a transformer including two coils inductively coupled to one another wherein one of said coils said first coupling means is secured so as to rotate with said first sensor about said first pivot axis relative to the other of said coils of said first coupling means, and one of said coils of said second coupling means is secured so as to rotate with said second sensor about said second pivot axis relative to the other of said coils of said second coupling means.

13. An apparatus according to claim 7, wherein said first coupling means includes means for applying a DC bias signal to said first sensor to null balance said first sensor.

14. An apparatus according to claim 13, wherein said second coupling means includes means for applying a DC bias signal to said second sensor to null balance said second sensor.

15. An apparatus according to claim 7, wherein said first and second components are substantially horizontal.

16. An apparatus according to claim 15, wherein said sensing means further comprises vertical sensor means for sensing a vertical component of said magnetic field.

17. An apparatus according to claim 16, wherein said vertical sensor means comprises two perpendicularly disposed sensors.

18. An apparatus according to claim 16, wherein said vertical sensor means comprises a third sensor for sensing said vertical component and wherein said apparatus further comprises third coupling means for inductively coupling said third sensor to a third port and for transferring a third electric signal between said third sensor and said third port, said third electric signal being representative of said vertical component.

19. An apparatus according to claim 18, wherein said apparatus further comprises means for supporting said third sensor so that said third sensor remains in a vertical orientation.

20. An apparatus according to claim 19, wherein said third coupling means further comprises means for inductively transferring a bias signal from said third port to said third sensor to null balance said third sensor.

21. An apparatus for measuring the amplitude of a magnetic field surrounding the apparatus, comprising:

A. a frame;

B. a first platform extending along a roll axis and gimbally mounted within the frame for rotation about the roll axis;

C. a first magnetometer having a sensing axis, the magnetometer for measuring the amplitude of a component of the magnetic field substantially parallel to the sensing axis, the first magnetometer being mounted within the first platform;

D. a first coil coupled in parallel with the first magnetometer and wound around a first portion of a perimeter of the first platform; and E. a second coil wound around a first portion of a perimeter of the frame such that the first and second coils form a transformer.

22. An apparatus according to claim 21, wherein the sensing axis is substantially perpendicular to the roll axis.

23. An apparatus according to claim 22, further comprising:
   A. a hollow casing, the frame being mounted within the casing;
   B. first and second excitation coils wound around the casing.

24. An apparatus according to claim 23, wherein the first excitation coil is substantially orthogonal to the second excitation coil.

25. An apparatus according to claim 22, further comprising:
   A. a second platform extending along a pitch axis and gimbally mounted within the first platform for rotation about the pitch axis;
   B. a second magnetometer having a second sensing axis substantially perpendicular to the pitch axis, the second magnetometer for measuring the amplitude of a component of the magnetic field substantially perpendicular to the pitch axis, the second magnetometer being mounted within the second platform;
   C. a third coil coupled in parallel with the second magnetometer and wound around a perimeter of the second platform;
   D. a forth coil wound around a recess of the first platform such that the forth and third coils form a second transformer;
   E. a fifth coil coupled in parallel with the forth coil and wound around a second portion of the perimeter of the first platform;
   F. a sixth coil wound around a second portion of the perimeter of the frame such that the sixth and fifth coils form a third transformer.

26. An apparatus according to claim 25, further comprising a hollow casing, the frame being mounted within the casing, the apparatus further comprising first and second excitation coils wound around a perimeter of the casing.

27. An apparatus according to claim 26, wherein the first excitation coil is substantially orthogonal to the second excitation coil.

28. An apparatus according to claim 25, further comprising third and forth magnetometers mounted within the first platform, the third magnetometer being mounted substantially orthogonal to the forth magnetometer, the third and forth magnetometers for measuring a vertical component of the magnetic field.

29. An apparatus according to claim 25, further comprising a third magnetometer gimbally mounted within the first platform so as to remain in a vertical orientation for measuring a vertical component of the magnetic field.

30. An apparatus according to claim 29, further comprising a hollow casing, the frame being mounted within the casing, the apparatus further comprising first, second, and third excitation coils wound around a perimeter of the casing.

31. An apparatus according to claim 30, wherein the first excitation coil is solenoidally wound around a portion of the casing surrounding the second magnetometer, and wherein the second excitation coil is solenoidally wound around a portion of the casing surrounding the third magnetometer, and wherein the third excitation coil comprises a cosine coil.

32. An apparatus for measuring the amplitude of a magnetic field surrounding the apparatus, comprising:

A. a frame;
B. a first platform extending along a roll axis and gimbally mounted within the frame for rotation about the roll axis;
C. a first magnetometer having a first sensing axis, the first magnetometer for measuring the amplitude of a component of the magnetic field substantially parallel to the first sensing axis, the first magnetometer being mounted within the first platform;
D. first and second coils wound around a first portion of a perimeter of the first platform;
E. first current control means coupled to the first magnetometer and to the first and second coils for establishing a uni-directional current flow path through the first magnetometer and the first coil and for establishing an oppositely oriented uni-directional current flow path through the first magnetometer and the second coil;
F. third and fourth coils wound around a first portion of a perimeter of the frame such that the fourth and the first coils form a first transformer characterized by a first coupling coefficient, and the fourth and the second coils form a second transformer characterized by a second coupling coefficient, and the third and the second coils form a third transformer characterized by a third coupling coefficient, and the third and the first coils form a fourth transformer characterized by a fourth coupling coefficient;
G. second current control means coupled to the third and fourth coils for establishing a uni-directional current flow path through the third coil and for establishing an oppositely oriented uni-directional current flow path through the fourth coil.

33. An apparatus according to claim 32, wherein the first and the third coupling coefficients are substantially equal and the second and fourth coupling coefficients are substantially equal and the first and third coupling coefficients are greater than the second and the fourth coupling coefficients.

34. An apparatus according to claim 32, wherein said first current control means comprises a first diode and a second diode, the first diode being coupled in series between the first magnetometer and the first coil, and the second diode being coupled in series between the first magnetometer and the second coil, and wherein the second current control means comprises a third diode and a forth diode, the third diode being coupled in series with the third coil, and the forth diode being coupled in series with the forth coil.

35. An apparatus according to claim 32, wherein the first sensing axis is substantially perpendicular to the roll axis.

36. An apparatus according to claim 35, further comprising:
   A. a hollow casing, the frame being mounted within the casing;
   B. first and second excitation coils wound around the casing.

37. An apparatus according to claim 36, wherein the first excitation coil is substantially orthogonal to the second excitation coil.

38. An apparatus according to claim 35, further comprising:
   A. a second platform extending along a pitch axis and gimbally mounted within the first platform for rotation about the pitch axis;
   B. a second magnetometer having a second sensing axis substantially perpendicular to the pitch axis, the second magnetometer for measuring the amplitude of a component of the magnetic field substantially perpendicular the pitch axis, the second magnetometer being mounted within the second platform;

C. fifth and sixth coils wound around a perimeter of the second platform;

D. third current control means coupled to the second magnetometer and to the fifth and sixth coils for establishing a uni-directional current flow path through the second magnetometer and the fifth coil and for establishing an oppositely oriented uni-directional current flow path through the second magnetometer and the sixth coil;

E. seventh and eighth coils wound around a recess of the first platform such that the seventh and fifth coils form a third transformer and such that the eighth and sixth coils form a forth transformer;

F. ninth and tenth coils wound around a second portion of the perimeter of the first platform, the ninth coil being coupled in parallel with the seventh coil and the tenth coil being coupled in parallel with the eighth coil;

G. eleventh and twelfth coils wound around a second portion of the frame such that the eleventh and ninth coils form a fifth transformer and such that the twelfth and tenth coils form an sixth transformer;

H. forth current control means coupled to the eleventh and twelfth coils for establishing a uni-directional current flow path through the eleventh coil and for establishing an oppositely oriented uni-directional current flow path through the twelfth coil.

39. An apparatus according to claim 38, further comprising a hollow casing, the frame being mounted within the casing, the compass further comprising first and second excitation coils wound around a perimeter of the casing.

40. An apparatus according to claim 39, wherein the first excitation coil is substantially orthogonal to the second excitation coil.

41. An apparatus according to claim 38, further comprising third and forth magnetometers mounted within the first platform, the third magnetometer being mounted substantially orthogonal to the forth magnetometer, the third and forth magnetometers for measuring a vertical component of the magnetic field.

42. An apparatus according to claim 38, further comprising a third magnetometer gimbally mounted within the first platform so as to remain in a vertical orientation for measuring a vertical component of the magnetic field.

43. An apparatus according to claim 42, further comprising a hollow casing, the frame being mounted within the casing, the compass further comprising first, second, and third excitation coils wound around a perimeter of the casing.

44. An apparatus according to claim 43, wherein the first excitation coil is solenoidally wound around a portion of the casing surrounding the second magnetometer, and wherein the second excitation coil is solenoidally wound around a portion of the casing surrounding the third magnetometer, and wherein the third excitation coil comprises a cosine coil.

45. An apparatus for measuring the magnetic heading of the earth's magnetic field, the apparatus comprising:

first and second magnetometers for respectively measuring components of the earth's magnetic field, the first and second magnetometers being gimbally mounted within a platform for maintaining the magnetometers in a horizontal orientation; and a first coupling for inductively transferring an electric signal between a first port and the first magnetometer, and a second coupling for inductively transferring an electric signal between a second port and the second magnetometer.

46. An apparatus for measuring the magnetic heading of the earth's magnetic field, the apparatus comprising:

first and second magnetometers for respectively measuring components of the earth's magnetic field, the first and second magnetometers being gimbally mounted within a platform for maintaining the magnetometers in a horizontal orientation; and a first coupling for inductively transferring a first bias signal from a first port to the first magnetometer, and a second coupling for inductively transferring a second bias signal between a second port and the second magnetometer.

* * * * *

UNITED STATES PATENT AND TRADEMARK OFFICE
CERTIFICATE OF CORRECTION

PATENT NO. : 5,560,115
DATED : October 1, 1996
INVENTOR(S) : J. Thomas Fowler

It is certified that error appears in the above-indentified patent and that said Letters Patent is hereby corrected as shown below:

```
Claim 25, column 19, line 29, delete "forth" and substitute therefor
                              -- fourth --;
           column 19, line 30, delete "forth" and substitute therefor
                              -- fourth --;
Cliam 28, column 19, line 46, delete "forth" and substitute therefor
                              -- fourth --;
           column 19, line 48, delete "forth" and substitute therefor
                              -- fourth --;
           column 19, line 49, delete "forth" and substitute therefor
                              -- fourth --;
Claim 34, column 20, line 45, delete "forth" and substitute therefor
                              -- fourth --;
           column 20, line 47, delete "forth" and substitute therefor
                              -- fourth --, first and second instances;
Claim 38, column 21, line 16, delete "forth" and substitute therefor
                              -- fourth --;
           column 21, line 26, delete "forth" and substitute therefor
                              -- fourth --;
```

UNITED STATES PATENT AND TRADEMARK OFFICE
CERTIFICATE OF CORRECTION

PATENT NO.   : 5,560,115
DATED        : October 1, 1996
INVENTOR(S)  : J. Thomas Fowler It is certified that error appears in the above-indentified patent and that said Letters Patent is hereby corrected as shown below:

Claim 41, column 21, line 39, delete "forth" and substitute therefor
— fourth —;
column 21, line 41, delete "forth" and substitute therefor
— fourth —; and
column 21, line 42, delete "forth" and substitute therefor
— fourth —.

Signed and Sealed this

Seventeenth Day of December, 1996

Attest:

BRUCE LEHMAN

*Attesting Officer*          Commissioner of Patents and Trademarks